United States Patent [19]

Sugiyama et al.

[11] Patent Number: 4,665,368

[45] Date of Patent: May 12, 1987

[54] NMR IMAGING APPARATUS

[75] Inventors: Tadashi Sugiyama; Hideto Iwaoka; Hiroyuki Matsuura, all of Tokyo, Japan

[73] Assignee: Yokogawa Hokushin Electric Corporation, Tokyo, Japan

[21] Appl. No.: 723,743

[22] Filed: Apr. 16, 1985

[51] Int. Cl.[4] .......................................... G01R 33/20
[52] U.S. Cl. .................................... 324/318; 324/309
[58] Field of Search ............... 324/318, 309, 307, 311, 324/322, 319, 300, 312, 320

[56] References Cited

U.S. PATENT DOCUMENTS 2,999,974  9/1961  Pinkley .
4,425,547  1/1984  Sugimoto ............................ 324/318
4,442,404  4/1984  Bergmann ........................... 324/309

FOREIGN PATENT DOCUMENTS 0203634  10/1983  German Democratic Rep. .................................... 324/307
1100547  6/1984  U.S.S.R. ............................. 324/312

Primary Examiner—Stewart J. Levy
Assistant Examiner—Scott M. Oldham
Attorney, Agent, or Firm—Moonray Kojima

[57] ABSTRACT

An NMR imaging apparatus which generates NMR signals cleared of foreign noises by adding a noise detecting coil, for detecting mainly the foreign noises, to an intrinsic detecting coil for detecting the NMR signals and by producing a difference from the outputs of the two detecting coils. As a result, the foreign noises can be eliminated simply and effectively without requiring expensive shielded rooms.

9 Claims, 19 Drawing Figures

Direction of Principal Magnetic Field

NMR IMAGING APPARATUS

BACKGROUND OF THE INVENTION

1. Field of Invention

This invention relates to an NMR imaging apparatus, and more particularly to such an apparatus having improved signal to noise ratio.

2. Description of the Prior Art

Apparatus using nuclear magnetic resonance (NMR) are known, and especially, in the medical field, such as an NMR imaging apparatus, wherein protons in a sliced imaginary portion of an object to be imaged are excited on a principle similar to an X-ray CT to determine NMR signals corresponding to respective projections in a number of directions of the object so that the intensities of the NMR signals in the respective positions of the object may be determined by a reconstructive method.

This apparatus is operated by applying a suitable combination of magnetic fields to the object through a coil device and by detecting the NMR signals induced by the detecting coil.

The detecting coil may be a saddle shaped coil, such as shown in FIG. 1. The saddle shaped coil is known to detect only NMR signal component in a y-zxis direction perpendicular to the z direction of a principal magnetic field Ho and to have therein a relatively uniform receiving sensitivity distribution.

In the arrangement described, noises from the outside are detected together with the NMR from the object. For example, the NMR signal having a magnetic intensity of 1,000 gauss and detected from a hydrogen nuclei has a frequency of about 4.2 MHz, which is near to the frequency of noises transmitted from radio broadcasting stations, wireless communications, computers, CRT devices, etc. Moreover, automobiles, electric trains, natural phenomena, such as thunder, etc, are also source of noises. Thus, the know NMR imaging apparatus cannot generate clear clean NMR signals which are not polluted with noise, unless such apparatus are located in a shielded room. But, shielded rooms require considerable auxiliary equipment, such as air conditioning in order to be operable, and limit the wide spread use of NMR apparatus.

SUMMARY OF THE INVENTION

Accordingly, an object of the invention is to overcome the aforementioned and other deficiencies and advantages of the prior art.

Another object is to provide an NMR imaging apparatus which is substantially free of foreign noises and does not require a shielded room for operation.

The foregoing and other objects are attained by the invention, which encompasses an NMR imaging apparatus comprising an intrinsic receiving coil for detecting an NMR signal; and at least one noise detecting coil having a detecting sensitivity to a magnetic flux in the same direction as that of the intrinsic receiving coil for detecting foreign noises so that the difference between the signals obtained from the receiving coil and the noise detecting coil may be produced and used as the NMR signal while only the foreign noises is eliminated.

DETAILED DESCRIPTION OF THE PREFERRED EMBODIMENTS

Figure 2:
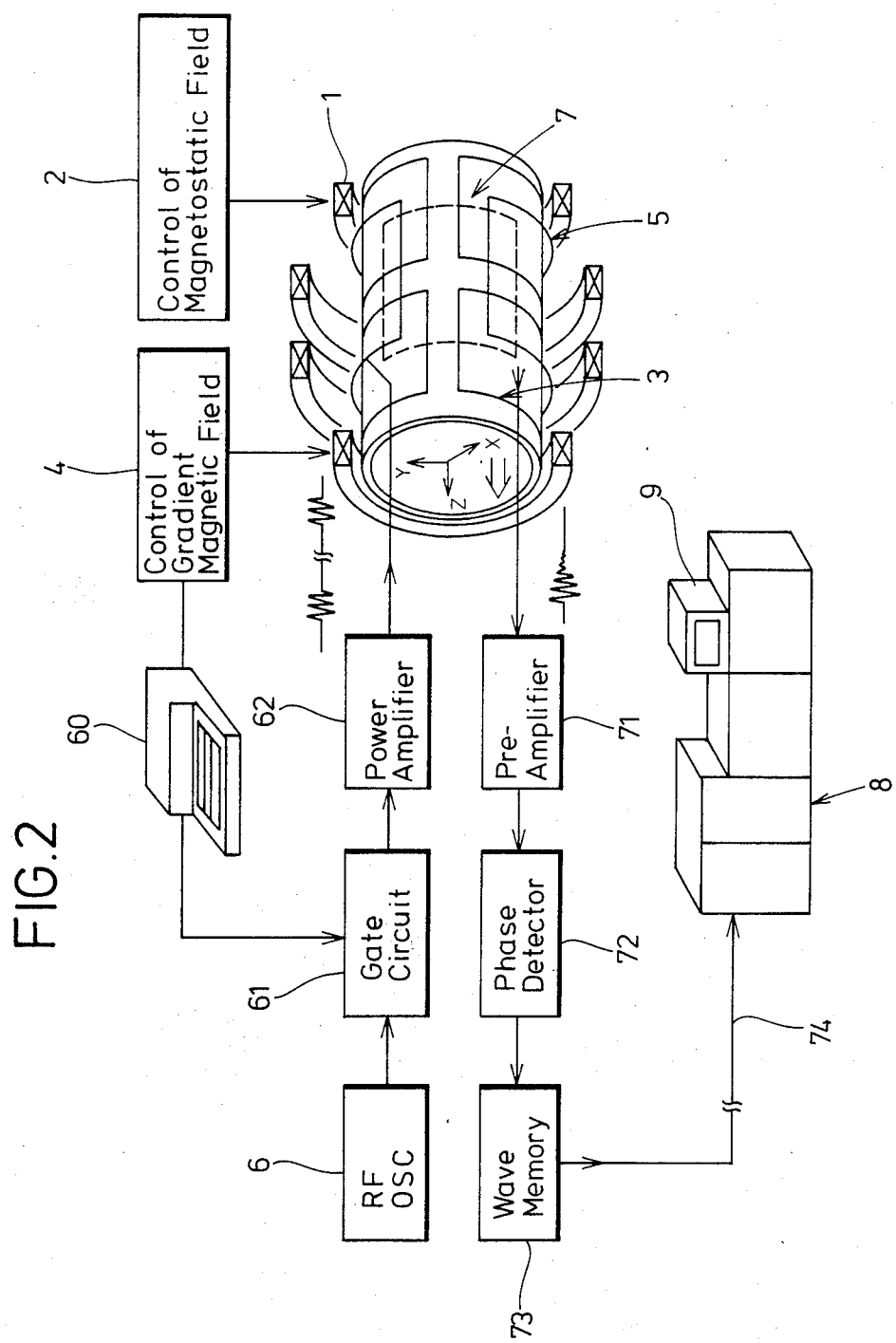
FIG. 2 is a block diagram depicting an illustrative embodiment of the invention.

FIG. 2 shows an NMR imaging apparatus comprising a magnetostatic coil 1 for generating a uniform magnetostatic field Ho (which is oriented in the z direction). Magnetostatic coil 1 is energized by a control circuit 2 to apply the magnetostatic field Ho to an object to be imaged. The body to be examined is positioned in the cylinder of the respective coils. In this state, a controller 60 first feeds an electric current to a z axis gradient magnetic field coil 3 through a control circuit 4 thereby to establish a z axis gradient magnetic field. Under these circumstances, a gate circuit 61 is turned ON to feed a signal from an RF oscillator 6 to a magnetizing coil 5 through an amplifier 62 thereby to excite one side of the object with 90 degree pulses having fine spectrum. As a result, an NMR signal is generated i.e. reradiated from the object being examined. This signal is detected by a detecting coil 7 and amplified by an amplifier 71. After this, the amplified signal has its phase detected by a phase detector 72 and then is stored in a wave memory 73. The NMR signal thus inputted to wave memory 73 is then introduced via cable 74 into a computer 8, in which it is subjected to Fourier transformation so that projection data are obtained for each projection.

Moreover, computer 8 reconstructs the sectional image of the sliced imaginary portion on the basis of those projection data and displays the sectional image in a TV monitor 9.

Figure 1:
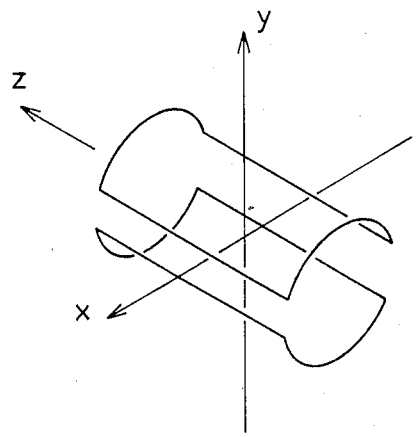
FIG. 1 is a schematic view depicting the arrangement of detecting coils used in a conventional NMR imaging apparatus.
Figure 3:
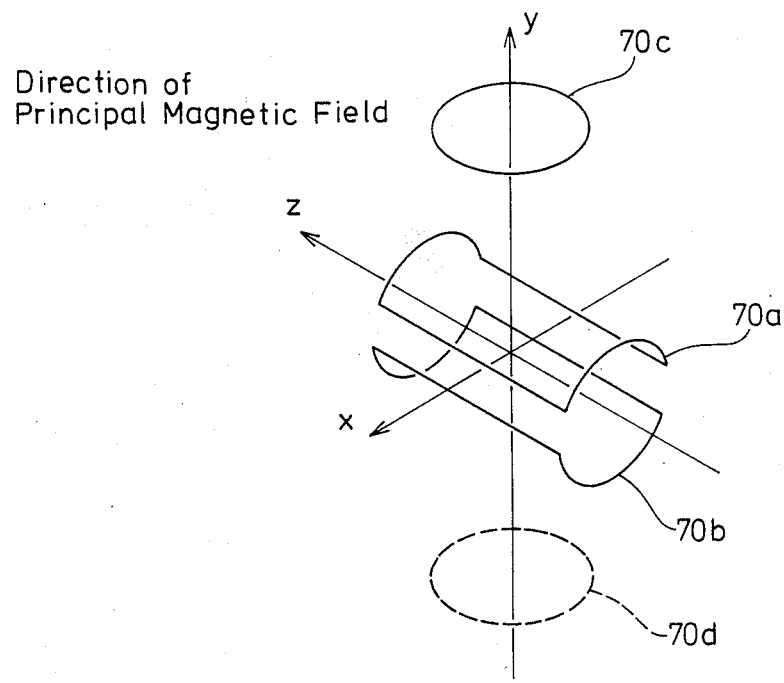
FIG. 3 is a schematic view depicting the arrangement of the coils of the invention.

Turning to FIG. 3, for easy understanding, the outer coils are shown vertically spaced. Detecting coils 70a and 70b, used for detecting the NMR signals from the object, are of the same saddle type as that of the prior art. Adjacent to these saddle type coils, there is arranged a noise detecting coil 70c which has detecting sensitivity to the magnetic flux in the same (i.e. y axis) direction as that of those detecting coils for detecting foreign noises arriving thereat. The number of noise detecting coil need not be limited to one. For example, another detecting coil (shown by dotted lines 70d) may be additionally arranged at the side opposed to the noise detecting coil 70c. Generally speaking, although FIG. 3 shows only one foreign noise coil, a plurality of foreign noise detecting coils may be arranged. Such an arrangement is made effective by taking a weighted mean from the noise components in various directions detected by the plurality of foreign noise coils even in the case of spacially irregular noises, such as when the noise is present in the neighborhood.

Moreover, the coil 70c as shown, is cylindrical but may take another shape, such as a saddle shape, As a matter of fact, more usable coils can be attained if the noise detecting coil or coils and the NMR signal detecting coils are of the same type, because they have equal sensitivity.

Figure 4:
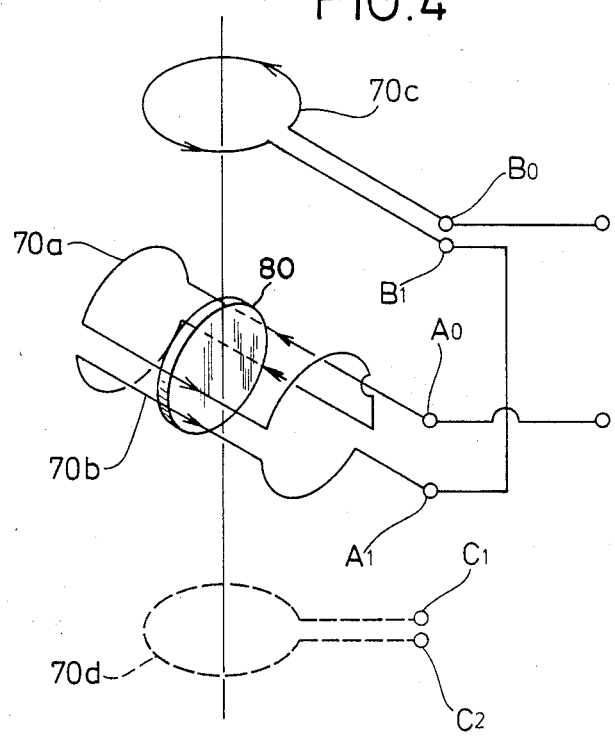
FIG. 4 is a schematic view depicting the electrical connections of the coils of FIG. 3.
Figure 5:
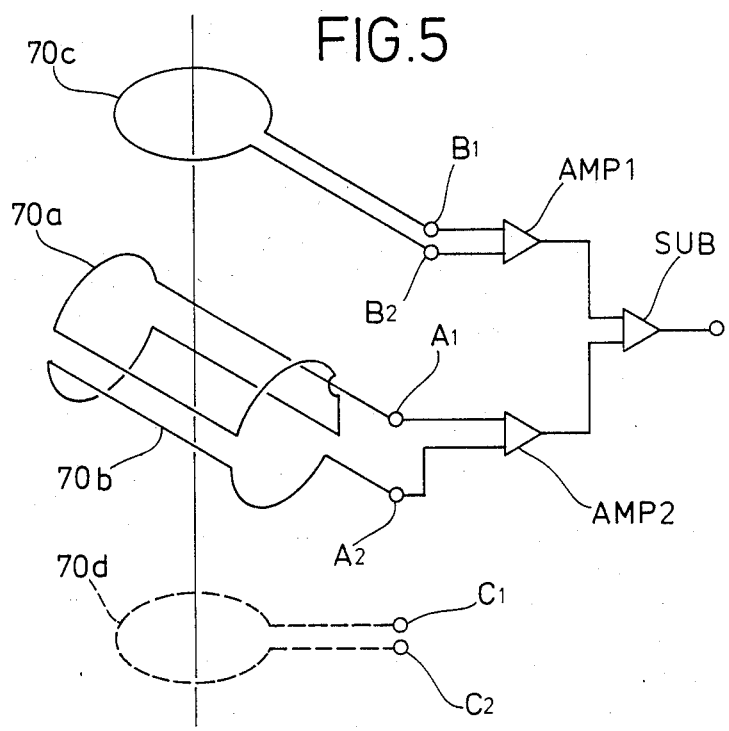
FIG. 5 is a schematic view depicting another electrical connection of the invention.

These detecting coils are arranged to produce a difference from the NMR signals detected from the respective coils and to use the difference as the NMR signal to be determined. The method used for making the difference from the respective signals, may be a method, as depicted in FIG. 4, of differentially connecting the output terminals A0 and A1 off the coils 70a and 70b directly with the output terminals B0 and B1 of the coil 70d. Another method, as depicted in FIG. 5, could be of making a difference by means of a subtractor SUB from the respective signals which have been amplified in advance by action of amplifiers AMP1 and AMP2. If the two detecting coils have different sensitivities, the method shown in FIG. 5 is more effective so that the noises can be offset by adjusting the amplifications and phase characteristics of the respective amplifiers.

With the arrangement shown, the NMR signal is detected, if detected from the object, in terms of a current flowing through the detecting coils. Since foreign noises are generated in a position spaced sufficiently from the coils, on the other hand, they give two sets of the detecting coils 70a and 70b and the noise detecting coil 70c (and the noise detecting coil 70d) equal magnetic flux densities. Here, if the two sets of coils have receiving sensitivities equal to each other, only the NMR signal appears as the output signal of each coil because those coils are connected in opposite directions (i.e. in a differential manner).

The noise detecting coil 70c can be made, in case it is one in number, to have the receiving sensitivity equal to that of the detecting coils 70a and 70b by changing its shape, size, turn number and etc.

However, in case the outputs of the respective coils are separately amplified, such as shown in FIG. 5, the amplifications and phase characteristics of the amplifiers AMP1 and AMP2 may be adjusted to eliminate the foreign noises. Those adjustments may be made each time the object to be examined is changed. The arrangement shown in FIG. 5 is effective in case the size and shape of the object are not fixed. This is because the receiving sensitivity can be adjusted by changing the amplifications and phase characteristics of the amplifiers in case it is changed in dependence upon the shape of the object.

On the other hand, the symmetric arrangement of the foreign noise detecting coils with respect to the detecting coils 70a and 70b is effected in case the foreign noises are not uniform in the y-axis direction. In this case, the two foreign noise detecting coils are arranged so that the summation of the outputs detected thereby is equal to the output of the NMR signal detecting coils thereby to eliminate only the foreign noises. It is desirable that the foreign noise detecting coils be arranged to detect no NMR signal. The arrangement of the foreign noise detecting coils, for such purpose, as seen in FIG. 3, is preferably outside of the principal magnet shown in FIG. 2. However, such coils can be inside of the magnet for other purposes. Although the foreign noises can be sufficiently eliminated by the invention, the noise eliminating effect can be further improved if the NMR imaging apparatus of the invention is used together with a simple shielded room.

Figure 6:
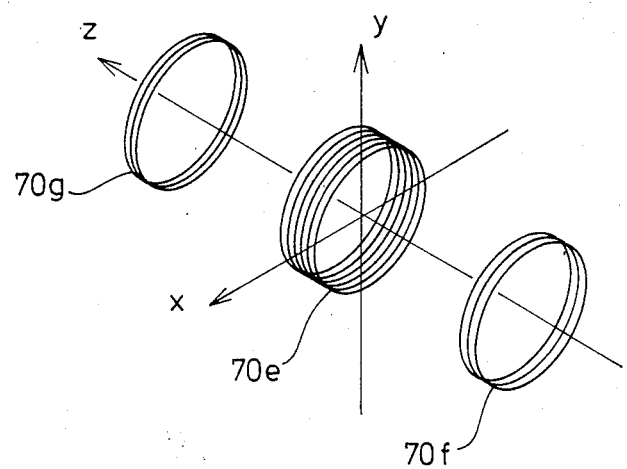
FIG. 6 depicts another illustrative coil arrangement.

FIG. 6 is a schematic view showing another arrangement of coils according to the invention. In the event the principal magnetic field is oriented in the y-axis direction, it is possible to use solenoid type detecting coils, as shown in FIG. 6. These respective coils detect the magnetic flux in the z-axis direction.

On the other hand, surface coils may be used as the detecting coils. The surface coils are used to detect the NMR signal in the vicinity of the surface of the object and usually take a shape of a circular coil of several turns or a modified shape.

Figure 7A:
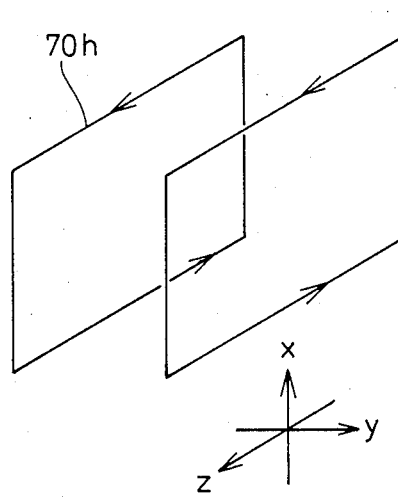
FIG. 7A depicts another illustrative flat coil arrangement.
Figure 7B:
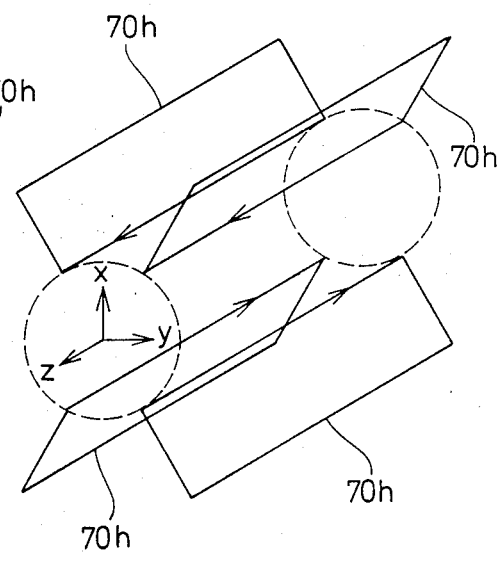
FIG. 7B, depicts the flat coils in a radial position.

Moreover, the NMR signal detecting coils need not be limited to these saddle shaped coils depicted, for example, in FIG. 3, but may be of other shapes. For example, as depicted in FIGS. 7(a) and 7(b) the coils may be two flat and rectangular coils arranged in parallel (FIG. 7(a)), or four similar coils arranged radially with respect to the x-y plane of (FIG. 7(b)).

On the other hand, the NMR signal detecting coils and the foreign noise detecting coil or coils are desired to be coincident in directions to sense the magnetic flux. Without this coincidence, however, the noise eliminating effect can still be expected to some extent.

Other illustrative examples of the inventive arrangement of NMR signal detecting coils and foreign noise detecting coils will now be described.

(1) Generally speaking, the object to be examined comes into the NMR signal detecting coils to provide a kind of antenna so that the foreign noises are increased. How much the foreign noises are increased is different depending on the object. Thus, the level of noises to be generated in the NMR signal detecting coils can be so adjusted that they can be accurately cancelled with the noises from the foreign noise detecting signals.

Figure 8A:
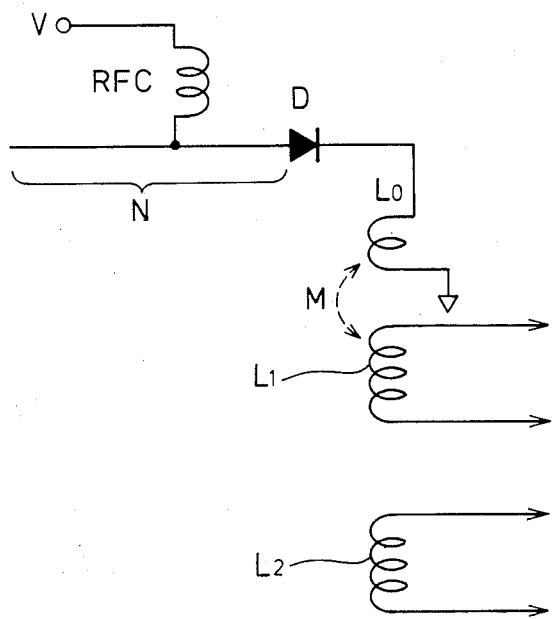
FIGS. 8A and 8B show electrical circuit connections of the invention having 2 resonant circuits.

A specific example of such an arrangement is shown in FIG. 8(a), wherein the capacitance of a varactor D is varied in accordance with a control voltage V. A resonance circuit comprising varactor D and coil L0 is coupled electromagnetically with a noise detecting coil L1. As a result, the voltage can be controlled to adjust the level of the noises to be applied to the noise detecting coil L1 so that the noise component to be detected by the NMR signal detecting coil can be controlled.

As a modification of the circuit of FIG. 8(a), the varactor may be eliminated, and the coupling degree M of the noises may be controlled by changing the distance between the coil L0 and the noise detecting coil. In place of the fact that a sensitivity adjusting unit N is coupled to the coil L0, moreover, a phantom 80 (see FIG. 4) corresponding to the object to enter the NMR signal detecting coil may be inserted into the foreign noise detecting coil. The phantom is, for example, an acrylic cylindrical body of a size similar to the human body and filled with water.

Figure 8B:
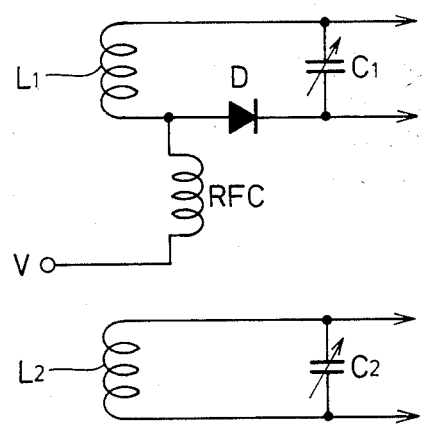

(2) In order to compensate for the drop in the value of Q, as a result of when the object enters the NMR signal detecting coil, the value Q is adjusted by applying a loss component to the noise detecting coil, as shown in FIG. 8(b). The varactor D has its resistance varied in accordance with the level of the voltage V applied.

(3) With the two resonance circuits, as in above examples (1) and (2), the NMR signal detecting coil and the noise detecting coil may be coupled to make the adjustment difficult. Thus, examples of the arrangement having one resonance circuit will now be described with reference to FIGS. 8(a), 9(b), 9(c) and 9(d).

Figure 9A:
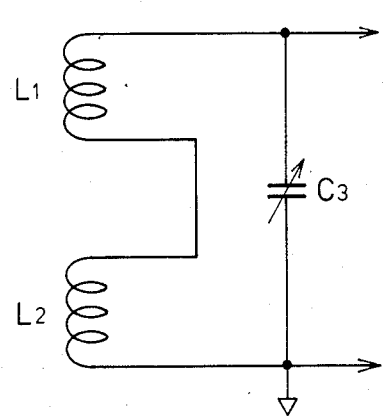
FIGS. 9A, 9B, show electrical circuits with 1 resonant circuit.
Figure 9B:
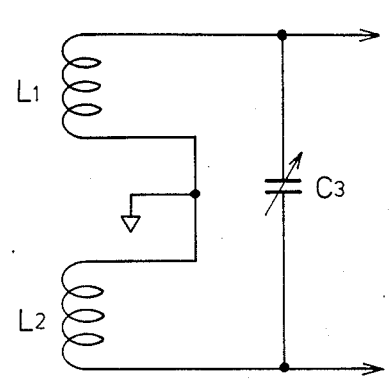
Figure 9C:
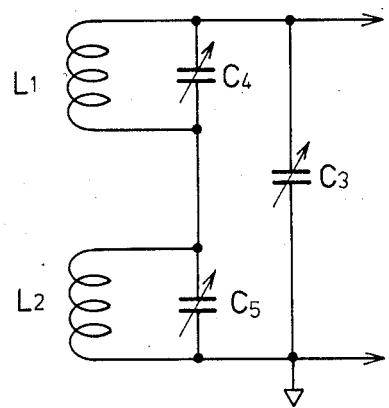
FIGS. 9C, 9D show the circuits of FIGS. 9A, 9B, respectively with added capacitors.
Figure 9D:
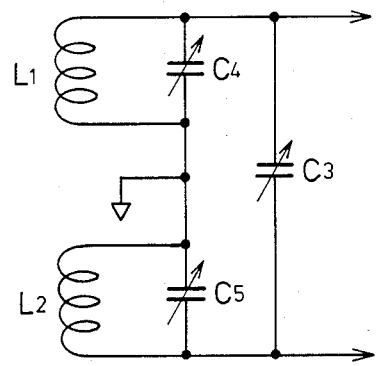

FIGS. 9(a) and 9(b) show examples wherein the signal is received at a single end and in a differential manner, respectively. On the other hand, FIGS. 9(c) and 9(d) show examples in which the capacitors of FIGS. 9(a) and 9(b) are separated, respectively.

The adjustment of the sensitivities of the NMR signal detecting coil and the foreign noise detecting coil can be automatically conducted by means of a computer in a state wherein the object to be examined is present in the coils. The adjustments can be realized, for example, by receiving the NMR signals several times before the imaging operations, and from trial and error data computing the optimum value from the NMR signal received.

Figure 10A:
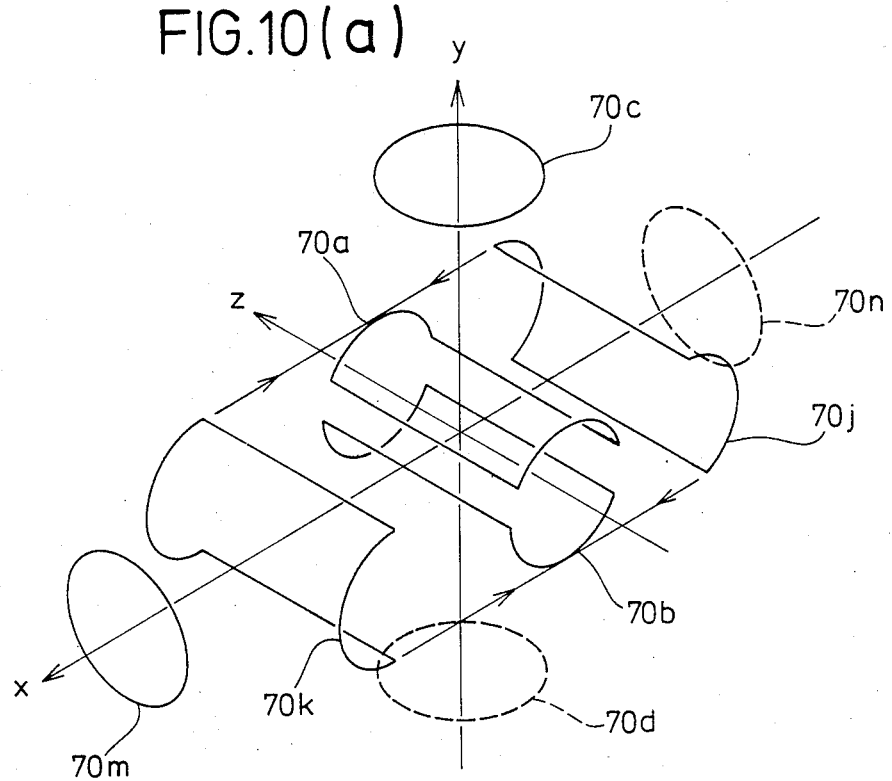
FIGS. 10A, 10B show further illustrative coil arrangements.
Figure 10B:
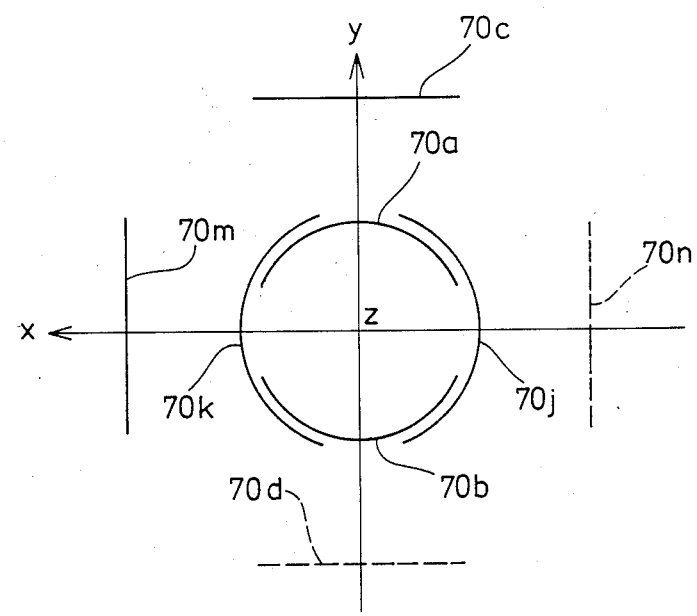

FIGS. 10(a) and 10(b) show further illustrative detecting coils, which are arranged now to detect the noises (such as thermal noises or noises due to eddy current losses) which are emitted from the object, as shown in a perspective view in FIG. 10(a) and in a schematic side elevational view in FIG. 10(b). The arrangement of FIGS. 10(a) and 10(b) is different from that of FIG. 3 in providing both second NMR signal detecting coils 70j and 70k of saddle type with a detecting sensitivity in the x axis direction; and an x axis foreign noise detecting coil 70m (and 70n) which is desired for eliminating foreign noises arriving in the x axis direction.

Figure 11A:
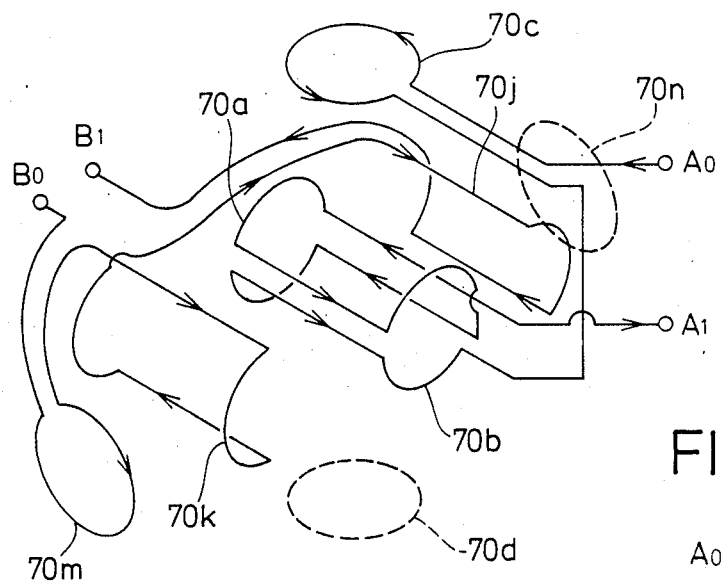
FIG. 11A, shows another illustrative coil arrangment.
Figure 11B:
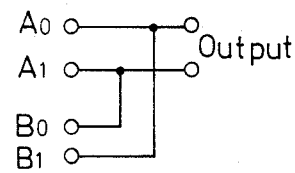
FIG. 11B shows output arrangment for the coils of FIG. 11A.
Figure 12:
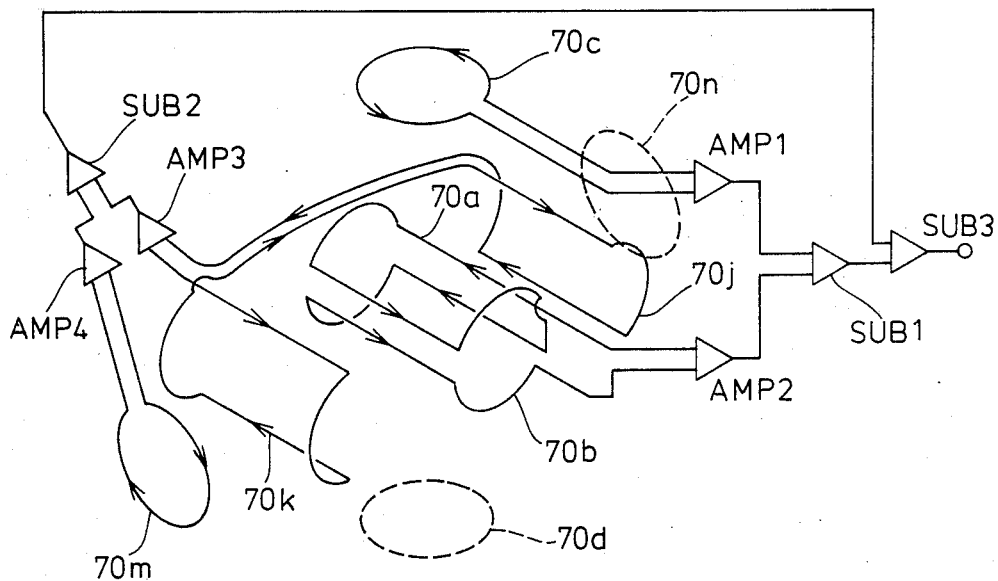
FIG. 12 shows another coil arrangement.

The connections between the saddle shaped coils 70j and 70k and the foreign noise detecting coil 70m (and 70n) are similar to those of the above discussed coils and will be described with reference to FIGS. 11(a) and 11(b). The output signal from each coil is extracted by the differential connection, as shown in FIG. 11(b). In case the output signals from the respective coils are obtained through the amplifiers, on the other hand, the difference between the respective outputs is made by the arrangement shown in FIG. 12.

Coils 70m and 70n need not be limited to the saddle shaped ones depicted, but may be, for example, those which are wound in a rectangular shape and arranged as shown in FIG. 7.

The reason why the pure NMR signals containing none of the foreign noises are generated by the above arrangement will now be described. If the NMR signals to be detected by the two perpendicular NMR signal receiving coils are designated $T_1(t)$ and $T_2(t)$, respectively, they are expressed by the following equations.

$$T_1(t) = \int\int\int f(x,y,z,t)dxdydz \cdot \cos(\omega t) \quad (1)$$

$$T_2(t) = \int\int\int f(x,y,z,t)dxdydz \cdot \sin(\omega t) \quad (2)$$

wherein, symbols $f(x,y,z,t)$ designates the intensity of the NMR signal from a point $(x,y,z)$ at a time t. Symbol $\omega$ designates the angular frequency of the NMR signal.

If letter k is substituted for the integrations in equations (1) and (2) and if the noises are designated at $n(t)$, the signals to be detected by the two perpendicular receiving coils are given by the following equations.

$$S_1(t) = k \cos(\omega t) + n(t) \quad (3)$$

$$S_2(t) = k \sin(\omega t) + n(t) \quad (4)$$

wherein, it is assumed that the foreign noises $n(t)$ have no directivity and that the sensitivities of the two receiving coils are equal.

If the difference between equations (3) and (4) is made, to be as follows $$S_1(t) - S_2(t) = k(\cos(\omega t) - \sin(\omega t)) \quad (5)$$
$$= 2k\sin(\omega t - \pi/4)$$

then, the pure NMR signals containing no foreign noise are obtained.

According to the arrangement thus far described, the foreign noises can be easily eliminated without any processing such as the averaging addition which has been conducted priorly so as to eliminate the foreign noises thereby to make it possible to produce the NMR signals from which the foreign noises can be eliminated at a single stroke.

As has been described above, according to the invention, there can be realized an NMR imaging apparatus which produces the NMR signals cleared of foreign noises and having an improved signal to noise (S/N) ratio, by adding a coil, especially for detecting the foreign noises, to the NMR detecting coil, and by producing a difference signal from the respective coils, and operating on such difference signal.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An NMR imaging apparatus comprising sequence control means for applying radio frequency pulses and a magnetic field to an object to be imaged, so that NMR signals are reradiated from said object, thereby to produce an image of the tissues of said object, by use of said NMR signals; wherein further comprising
    an NMR signal detecting coil for detecting said NMR signals reradiated from said object; and
    a separate foreign noise detecting coil positioned to have a detecting sensitivity to a magnetic flux in the same direction as that of said NMR signal detecting coil, and for detecting foreign noises external to said object; and
    control and connecting means connected to said NMR signal detecting coil and to said foreign noise detecting coil for obtaining a difference signal from the output signals from said NMR signal detecting coil and said foreign noise detecting coil, and for producing resulting output NMR signals which are substantially free of foreign noises.

2. The apparatus of claim 1, wherein said noise detecting coil comprises means for controlling the level of arriving foreign noises.

3. The apparatus of claim 1, wherein said noise detecting coil comprises means for controlling the resistance or inductance thereof.

4. The apparatus of claim 1, wherein said noise detecting coil comprises a resonance circuit connected therewith and including a capacitor, and means for controlling the capacitance of said capacitor.

5. The apparatus of claim 1, wherein said NMR signal detecting coil comprises means for controlling the resistance or inductance thereof.

6. The apparatus of claim 1, wherein said NMR signal detecting coil comprises a resonance circuit connected therewith and including a capacitor, and means for controlling the capacitance of said capacitor.

7. The apparatus of claim 1, wherein said noise detecting coil comprises a phantom therein.

8. The apparatus of claim 1, wherein said control and connecting means comprises a sequence controller for effecting manual or automatic adjustments so that the foreign noise components detected by said noise detecting coil and said NMR signal detecting coil is identical and that the signal to noise ratio of the NMR signals obtained is maximized.

9. An NMR imaging apparatus comprising sequence control means for applying radio frequency pulses and a magnetic field to an object to be imaged so that NMR signals are reradiated from said object thereby to produce an image of the tissues of said object by use of said NMR signals; wherein further comprising
    an NMR signal detecting coil comprising
        a combination of an NMR signal detecting coil for detecting said NMR signals, and a first foreign noise detecting coil having a detecting sensitivity to a magnetic flux in the same direction as that of said NMR signal detecting coil for detecting foreign noises, and
        a combination of a second NMR signal detecting coil having a detecting sensitivity to a magnetic flux in a direction perpendicular to that of said first named NMR signal detecting coil, and a second foreign noise detecting coil having a detecting sensitivity to a magnetic flux in the same direction of said second NMR signal detecting coil; and
    connecting means
        for making a difference from the outputs of the first named NMR signal detecting coil and said first foreign noise detecting coil;
        for making a difference from the outputs of said second named NMR signal detecting coil and said second foreign noise detecting coil; and
        for making a difference from the first and second named differences;
        whereby both the foreign noises contained in the NMR signals obtained and the noises emitted from said object are substantially eliminated.

* * * * *